(12) United States Patent
Watanabe et al.

(10) Patent No.: US 7,394,631 B2
(45) Date of Patent: Jul. 1, 2008

(54) ELECTROSTATIC PROTECTION CIRCUIT

(75) Inventors: Kentaro Watanabe, Kawasaki (JP); Koichi Sato, Yokohama (JP); Takayuki Hiraoka, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 120 days.

(21) Appl. No.: 11/511,520

(22) Filed: Aug. 29, 2006

(65) Prior Publication Data
US 2007/0047162 A1    Mar. 1, 2007

(30) Foreign Application Priority Data
Aug. 30, 2005   (JP)   ............... 2005-249898

(51) Int. Cl.
*H02H 3/22*    (2006.01)
(52) U.S. Cl. .......................................... 361/56; 361/111
(58) Field of Classification Search ................... 361/56, 361/111; 326/23, 27, 81
See application file for complete search history.

(56) References Cited
U.S. PATENT DOCUMENTS
5,239,440 A * 8/1993 Merrill ......................... 361/56
6,400,540 B1 * 6/2002 Chang ......................... 361/56
6,765,772 B2 7/2004 Lee et al.
2004/0105201 A1 6/2004 Wu et al.

* cited by examiner

*Primary Examiner*—Michael J Sherry
*Assistant Examiner*—Danny Nguyen
(74) *Attorney, Agent, or Firm*—Banner & Witcoff, Ltd

(57) ABSTRACT

An electrostatic protection circuit including: a first power supply terminal 110; a second power supply terminal 112; an input-output terminal 111 for an external connection; a P-type MOSFET for a buffer 108 for pulling up input and output to a high-level potential; an N-type MOSFET for the buffer 107 for pulling down the input and output to a low-level potential; a rectifying element 109 connected between the first and second power supply terminals; a detector 101 for comparing the potential of the input-output terminal 111 to the potential of the first power supply terminal 110 to detect whether or not an electrostatic surge is flowing in; and controllers 105 and 106, wherein the controllers 105 and 106 control a gate potential of the N-type MOSFET 107 for the buffer when the detector 101 detects inflow of the electrostatic surge and turn off the N-type MOSFET 107 for the buffer. Discharge of the electrostatic surge is performed through a parasitic bipolar junction transistor 121 formed on the N-type MOSFET 107.

20 Claims, 8 Drawing Sheets

ELECTROSTATIC PROTECTION CIRCUIT

CROSS-REFERENCE TO RELATED APPLICATIONS

This application is based upon and claims the benefit of priority from the prior Japanese Patent Application No. 2005-249898 riled on Aug. 30, 2005; the entire contents of which are incorporated herein by reference.

BACKGROUND OF THE INVENTION

1. Field of the Invention

The present invention relates to an electrostatic protection circuit for protecting a semiconductor device so as not to destroy it in the case where a surge due to electro static discharge (ESD) from outside (hereafter, referred to as electrostatic surge) flows into the semiconductor device.

2. Description of Related Art

In recent years, higher integration of a semiconductor device has been promoted by progress in semiconductor technology, and the semiconductor device is consequently becoming more vulnerable to destruction of a gate insulator and the like by electrostatic surge. To be more specific, there has been a higher possibility that elements in an input-output circuit and an internal circuit configuring the semiconductor device are destroyed or performance thereof is lowered by the electrostatic surge infiltrating in the semiconductor device from an external connection input-output pad (hereafter, referred to as an I/O terminal). For that reason, there is provided an electrostatic protection circuit for protecting the input-output circuit and internal circuit in the semiconductor device from the electrostatic surge. Such an electrostatic protection circuit is intended to prevent a situation in an manufacturing process of the semiconductor device where, on contacting the I/O terminal with a part of a human body or equipment, static electricity is instantaneously accumulated in the input-output circuit and a surge current passes based on stored charge thereof to lead to destruction of the elements in the input-output circuit and internal circuit.

Thus, when the electrostatic surge is inputted, the charge rapidly accumulated in the input-output circuit is dissipated by using the protection circuit so as to discharge the electrostatic surge. Such an ESD protection circuit may also be provided in the input-output circuit of the semiconductor device.

As a method for protecting the internal circuit when the electrostatic surge is inputted to the I/O terminal, there is a proposed method of using a grounded gate NMOSFET (referred to as GGNMOS) and a source connected gate PMOSFET (referred to as SGPMOS).

For instance, the ESD protection circuit using the GGNMOS and SGPMOS is shown in FIG. 2 of U.S. Pat. No. 6,765,772. Reference characters M20A and M21A of FIG. 2 denote the GGNMOS, and M20B and M21B denote the SGPMOS.

As for the GGNMOS and SGPMOS, a gate terminal is connected to a source terminal and a substrate terminal, and MOSFET operation is in an off state. When the electrostatic surge is applied to drain terminals of the GGNMOS and SGPMOS, the MOSFET operation remains off. However, a parasitic bipolar junction transistor (referred to as a parasitic BJT) is turned on between a collector and an emitter (that is, between a drain and a source) to have the electrostatic surge discharged. The parasitic BJT is parasitic on an MOSFET while rendering the drain terminal as a collector terminal, the source terminal as an emitter terminal and the substrate terminal as a base terminal.

A principle of operation of the parasitic BJT of the GGNMOS and SGPMOS is as follows. First, a high voltage is generated by the electrostatic surge in a junction of the drain. It causes a junction breakdown so that a current passes between the drain and the substrate. As the base of the BJT is connected to the substrate terminal via a relatively high-resistance well area, the base is biased by an IR voltage drop. As the base is biased, the BJT is turned on between the collector and the emitter to have the electrostatic surge discharged.

In the case of using the GGNMOS and SGPMOS for ESD protection on an input-output buffer, the MOSFETs for the output buffer are connected in parallel with the GGNMOS and SGPMOS as shown in FIG. 2 of U.S. Pat. No. 6,765,772. As for the MOSFETs for the output buffer, reference characters M22A and M23A of FIG. 2 denote buffer NMOSFETs for pull-down, and M22B and M23B denote buffer PMOSFETs for pull-up.

When the electrostatic surge is applied to the I/O terminal, an electric potential of the gate of the MOSFET for the output buffer may be the electric potential for turning on as the operation of the MOSFET.

Thought is given, by way of example, to the case where the electrostatic surge of positive polarity is applied to the I/O terminal with a low-level side power supply terminal (hereafter, referred to as a V SS terminal) as a reference potential. The I/O terminal has the buffer PMOSFET and SGPMOS connected thereto. As a PN junction diode is parasitic between the drain and the substrate of the buffer PMOSFET and SGPMOS, a high-level side power supply terminal (hereafter, referred to as a V DD terminal) connected to the substrate terminal is boosted to a positive potential to be conducting from the I/O terminal to the substrate via the PN junction diode. For that reason, a logic circuit for controlling an output buffer is in an operable state when applying the electrostatic surge. The electric potential of a control signal of the logic circuit is indefinite, and there may be the cases where a gate potential of the output buffer becomes on depending on a configuration of the logic circuit.

In the case where the drain of the MOSFET for the output buffer is boosted by the electrostatic surge at the potential for turning on the gate, the parasitic BJT of the MOSFET for the output buffer is turned on at a lower drain voltage than the GGNMOS and SGPMOS of the potential at which the gate is off. This is because a drain current of the MOSFET for the output buffer which is reversing is superimposed on an emitter current of the parasitic BJT.

Thus, in the case where the MOSFET for the output buffer of the potential for turning on the gate operates as a discharge device at a lower potential than the potential at which the GGNMOS and SGPMOS operate as discharge devices, it is feared that the currents gather on the MOSFET for the output buffer and a sufficient withstand voltage cannot be secured by the MOSFET for the output buffer so as to lead to destruction.

As measures against the fear, there is a proposal of a circuit and a method as shown in FIG. 3 of U.S. Pat. No. 6,765,772. The measures and method of a similar concept are disclosed in US Patent Application Laid-Open No. 2004/0105201 A1. When a potential V cc of the V DD terminal is boosted by the electrostatic surge, an input terminal of a switching circuit 46 is boosted via a diode string denoted by a reference numeral 44, and the gates of the buffer NMOSFETs (M52A, M53A) are fixed at a low level via a driving circuit 48 to turn off the buffer NMOSFETs.

On normal operation, the input terminal of the switching circuit 46 is at a potential lower than the potential V cc by a potential of a turn-on voltage 0.7 V of the diode □ [number of stages of a diode string 44]. It is set up to be at a potential below a circuit threshold of the switching circuit 46 by adjusting the number of stages of the diode string 44 so as not to influence circuit operation of an I/O buffer circuit 50.

In the case of using the circuit proposed by U.S. Pat. No. 6,765,772, however, there is no circuit for lowering the potential when the potential of a node as an output terminal of the diode string 44 and the input terminal of the switching circuit 46 is boosted due to influence of noise and the like. Therefore, there is a danger that the circuit may malfunction. As a measure for avoiding this danger, there is a thinkable method of inserting a resistance between the node and the ground terminal as indicated in claim 13 of US Patent Application Laid-Open No. 2004/0105201 A1. In the case of taking such a measure, however, it is necessary to boost the potential of the node as the input terminal of the switching circuit 46 by passing a current through the resistance and causing the IR voltage drop in order to operate the switching circuit 46 when the electrostatic surge is applied. For that reason, a sufficiently large current should be passed through the diode string 44, and the potential V cc of the V DD terminal needs to be sufficiently boosted for that purpose. Nevertheless, an allowable maximum value of V cc is the voltage at which the parasitic BJT of the MOSFET for the output buffer is turned on, and it is necessary to work out a design so that the switching circuit 46 operates at a lower voltage than that. For this reason, a method of reducing the number of stages of the diode string 44 is thinkable as the method of lowering the voltage. In that case, however, a both-end voltage of the resistance increases and a leakage current between V cc and the ground increases so that wasteful power consumption increases. Therefore, there is a limit to a design margin for simultaneously satisfying a specification of a required leakage current and a specification of the value of V cc for operating the switching circuit 46 when the electrostatic surge is applied. There are the cases where both cannot be satisfied in some cases.

SUMMARY OF THE INVENTION

An electrostatic protection circuit according to an aspect of the present invention is the one including: a first power supply terminal; a second power supply terminal; an input-output terminal for an external connection; a P-type MOSFET for a buffer for pulling up a potential of the input-output terminal to the potential of the first power supply terminal; an N-type MOSFET for the buffer for pulling down the potential of the input-output terminal to the potential of the second power supply terminal; a rectifying element having an anode terminal connected to the first power supply terminal and a cathode terminal connected to the second power supply terminal; a detector for comparing the potential of the input-output terminal to the potential of the first power supply terminal or comparing the potential of the input-output terminal to the potential of the second power supply terminal to detect whether or not an electrostatic surge is flowing into the input-output terminal; and a controller for controlling a gate potential of one of the N-type MOSFET for the buffer and P-type MOSFET for the buffer when the detector detects inflow of the electrostatic surge and turning off the MOSFET for the buffer of which gate potential is controlled out of the N-type MOSFET for the buffer and P-type MOSFET for the buffer.

An electrostatic protection circuit according to another aspect of the present invention is the one including: a first power supply terminal; a second power supply terminal; an input-output terminal for an external connection; a first P-type MOSFET for the buffer for pulling up a potential of the input-output terminal to the potential of the first power supply terminal; a first N-type MOSFET for the buffer for pulling down the potential of the input-output terminal to the potential of the second power supply terminal; a second P-type MOSFET connected between the first power supply terminal and the input-output terminal for the sake of discharging an electrostatic surge; a second N-type MOSFET connected between the input-output terminal and the second power supply terminal for the sake of discharging the electrostatic surge; a rectifying element having an anode terminal connected to the first power supply terminal and a cathode terminal connected to the second power supply terminal; a detector for comparing the potential of the input-output terminal to the potential of the first power supply terminal or comparing the potential of the input-output terminal to the potential of the second power supply terminal to detect whether or not the electrostatic surge is flowing into the input-output terminal; and a controller for controlling either a set of a gate potential of the first N-type MOSFET for the buffer and a gate potential of the second N-type MOSFET or a set of a gate potential of the first P-type MOSFET for the buffer and a gate potential of the second P-type MOSFET when the detector detects inflow of the electrostatic surge and turning on the set of which gate potentials are controlled out of the set of the first N-type MOSFET for the buffer and second N-type MOSFET and the set of the first P-type MOSFET for the buffer and second P-type MOSFET.

An electrostatic protection circuit according to another aspect of the present invention is the one including: a first power supply terminal; a second power supply terminal; an input-output terminal for an external connection; a P-type MOSFET for a buffer for pulling up a potential of the input-output terminal to the potential of the first power supply terminal; an N-type MOSFET for the buffer for pulling down the potential of the input-output terminal to the potential of the second power supply terminal; a rectifying element having an anode terminal connected to the first power supply terminal and a cathode terminal connected to the second power supply terminal; a first detector for comparing the potential of the input-output terminal to the potential of the first power supply terminal to detect whether or not an electrostatic surge is flowing into the input-output terminal; a second detector for comparing the potential of the input-output terminal to the potential of the second power supply terminal to detect whether or not an electrostatic surge is flowing into the input-output terminal; a first controller for controlling a gate potential of the N-type MOSFET for the buffer when the first detector detects inflow of the electrostatic surge and turning off the N-type MOSFET for the buffer, and a second controller for controlling a gate potential of the P-type MOSFET for the buffer when the second detector detects inflow of the electrostatic surge and turning off the P-type MOSFET for the buffer.

DETAILED DESCRIPTION OF THE INVENTION

Embodiments of the present invention will be described with reference to the drawings.

Figure 1:
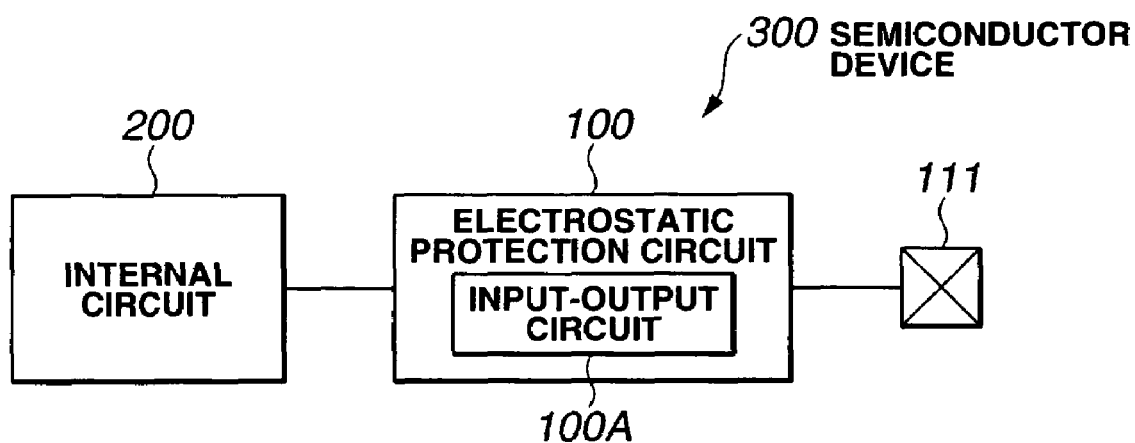
FIG. 1 is a block diagram schematically showing a configuration of a semiconductor device including an electrostatic protection circuit according to an embodiment of the present invention.

FIG. 1 is a block diagram schematically showing a configuration of a semiconductor device including an electrostatic protection circuit according to an embodiment of the present invention. Here, it exemplifies the case of applying the electrostatic protection circuit to an input-output circuit.

As shown in FIG. 1, a semiconductor device 300 includes an I/O terminal 111 for an external connection, an electrostatic protection circuit 100 provided between the I/O terminal 111 and an internal circuit 200 and the internal circuit 200.

The electrostatic protection circuit 100 has a configuration in which an input-output circuit 100A is provided with an electrostatic protection function, where the input-output circuit 100A and internal circuit 200 are protected so as not to be damaged by an electrostatic surge infiltrating from the I/O terminal 111. An MOSFET which is an input-output buffer (hereafter, referred to as a buffer MOSFET) is used as the input-output circuit 100A.

Such an electrostatic protection circuit 100 detects a flow of the electrostatic surge into the I/O terminal, and uses the buffer MOSFET configuring the input-output circuit and a parasitic BJT thereof to discharge currents of the electrostatic surge. A gate potential of the buffer MOSFET is controlled on input of the electrostatic surge so as not to gather the currents on the buffer MOSFET. The circuit causing no damage to the buffer MOSFET is thus realized. Furthermore, the electrostatic protection circuit 100 eliminates a leakage current due to resistance, involves no wasteful power consumption and secures sufficient withstand voltage on the buffer MOSFET to prevent destruction of the buffer MOSFET due to an overcurrent.

First to fourth embodiments described below indicate the cases where the electrostatic protection circuit is configured by including an output circuit. To be more specific, the embodiments show the configurations in which the output circuit is provided with the electrostatic protection function.

First Embodiment

Figure 2:
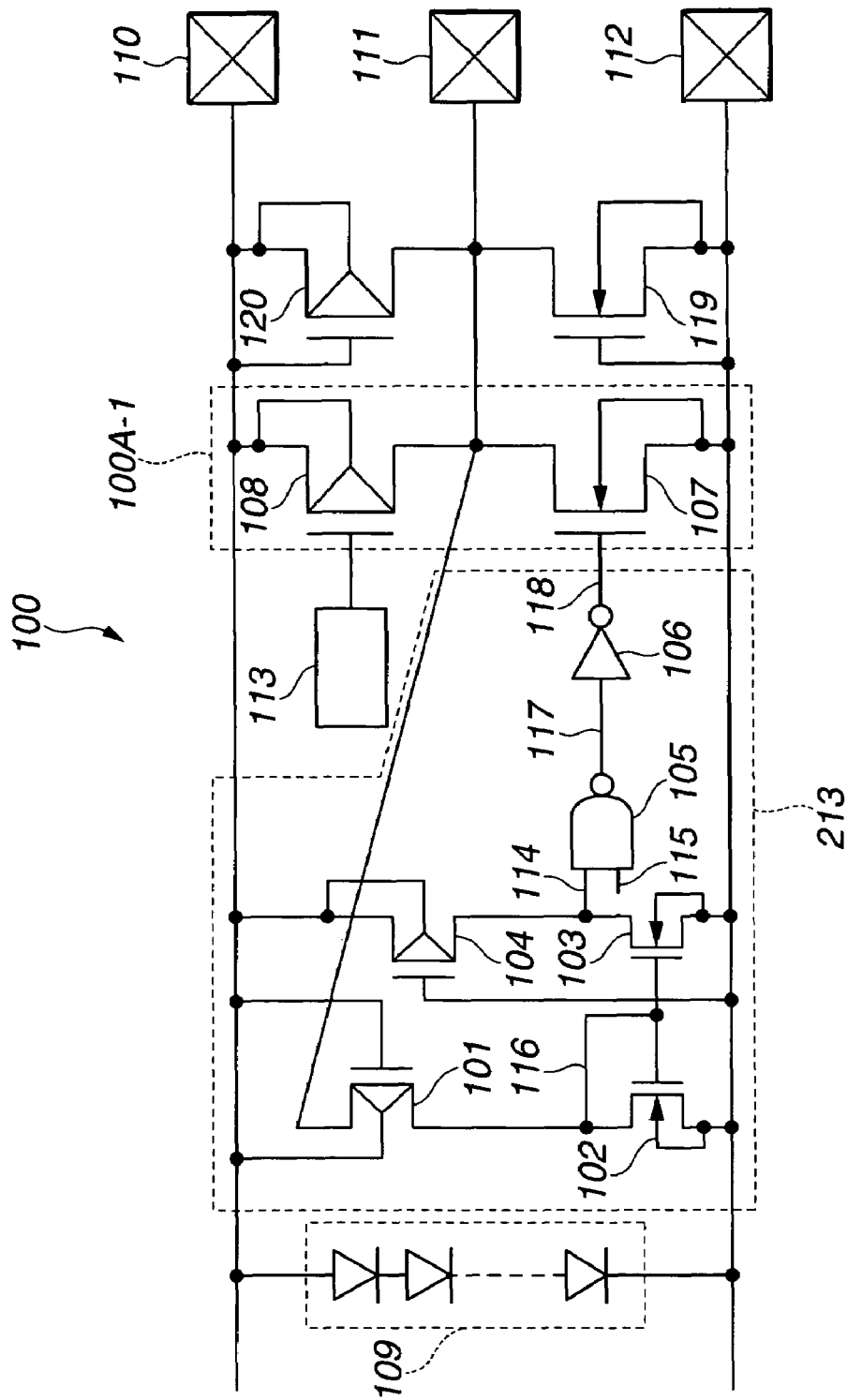
FIG. 2 is a circuit diagram showing the electrostatic protection circuit according to a first embodiment of the present invention.

FIG. 2 is a circuit diagram showing the electrostatic protection circuit according to the first embodiment of the present invention.

The electrostatic protection circuit 100 shown in FIG. 2 includes an N-type MOSFET for a buffer (hereafter, referred to as a buffer NMOSFET) 107 and a P-type MOSFET for a buffer (hereafter, referred to as a buffer PMOSFET) 108 as output buffers configuring an output circuit 100A-1. The electrostatic protection circuit 100 realizes the electrostatic protection function against the electrostatic surge in conjunction with other circuit elements (a V DD terminal 110, the I/O terminal 111, a V SS terminal 112, P-type MOSFETs (hereafter, referred to as PMOSFETs) 101, 104, N-type MOSFETs (hereafter, referred to as NMOSFETs) 102, 103, an NAND circuit 105, an inverter circuit 106, a diode string 109, a buffer PMOSFET control circuit 113, a GGNMOS 119 and an SGPMOS 120). The PMOSFET 101, NMOSFET 102, NMOSFET 103, PMOSFET 104, NAND circuit 105 and inverter circuit 106 configure a buffer NMOSFET control circuit 213.

The first embodiment shows the electrostatic protection circuit which has the V SS terminal 112 at a reference potential in a state of having no power supply voltage applied to the V DD terminal 110 and V SS terminal 112, prevents the overcurrent from passing through the buffer NMOSFET 107 as the output buffer and destroying it when a positive electrostatic surge is applied to the I/O terminal 111 and allows the electrostatic surge to be discharged.

The V DD terminal 110 represents a first power supply terminal on a high-level side, the I/O terminal 111 represents an input-output terminal for an external connection, and the V SS terminal 112 represents a second power supply terminal on a low-level side.

The buffer NMOSFET 107 is the output buffer for pulling down the potential of the I/O terminal 111 to the potential of the V SS terminal 112. The buffer NMOSFET 107 has a source terminal and a substrate terminal thereof connected to the V SS terminal 112 and a drain terminal thereof connected to the I/O terminal 111.

The buffer PMOSFET 108 is the output buffer for pulling up the potential of the I/O terminal 111 to the potential of the V DD terminal 110. The buffer PMOSFET 108 has a source terminal and a substrate terminal thereof connected to the V DD terminal 110 and a drain terminal thereof connected to the I/O terminal 111.

The buffer PMOSFET control circuit 113 is configured by an NMOSFET 201, a PMOSFET 202, a PMOSFET 203, an NMOSFET 204, an NOR circuit 205 and an inverter circuit 206 shown in FIG. 5, and functions thereof will be described in the second embodiment in FIG. 5. In the case where the positive electrostatic surge is applied to the I/O terminal 111 with the V SS terminal 112 at the reference potential in the state of having no power supply voltage applied to the V DD terminal 110 and V SS terminal 112, the buffer PMOSFET control circuit 113 does not operate and is not directly involved in electrostatic surge protection operation by the buffer NMOSFET 107. For this reason, a detailed configuration of the buffer PMOSFET control circuit 113 is omitted in the first embodiment in order to render a main configuration of FIG. 2 easy to see.

The PMOSFET 101 functions as a detector for detecting the electrostatic surge. A gate terminal of the PMOSFET 101 is connected to the V DD terminal 110, the source terminal of the PMOSFET 101 is connected to the I/O terminal 111, and the substrate terminal of the PMOSFET 101 is connected to the V DD terminal 110.

The diode string 109 as a rectifying element is connected between the V DD terminal 110 and V SS terminal 112. The diode string 109 is configured by connecting N pieces (N is a positive integer) of diode in series.

Figure 5:
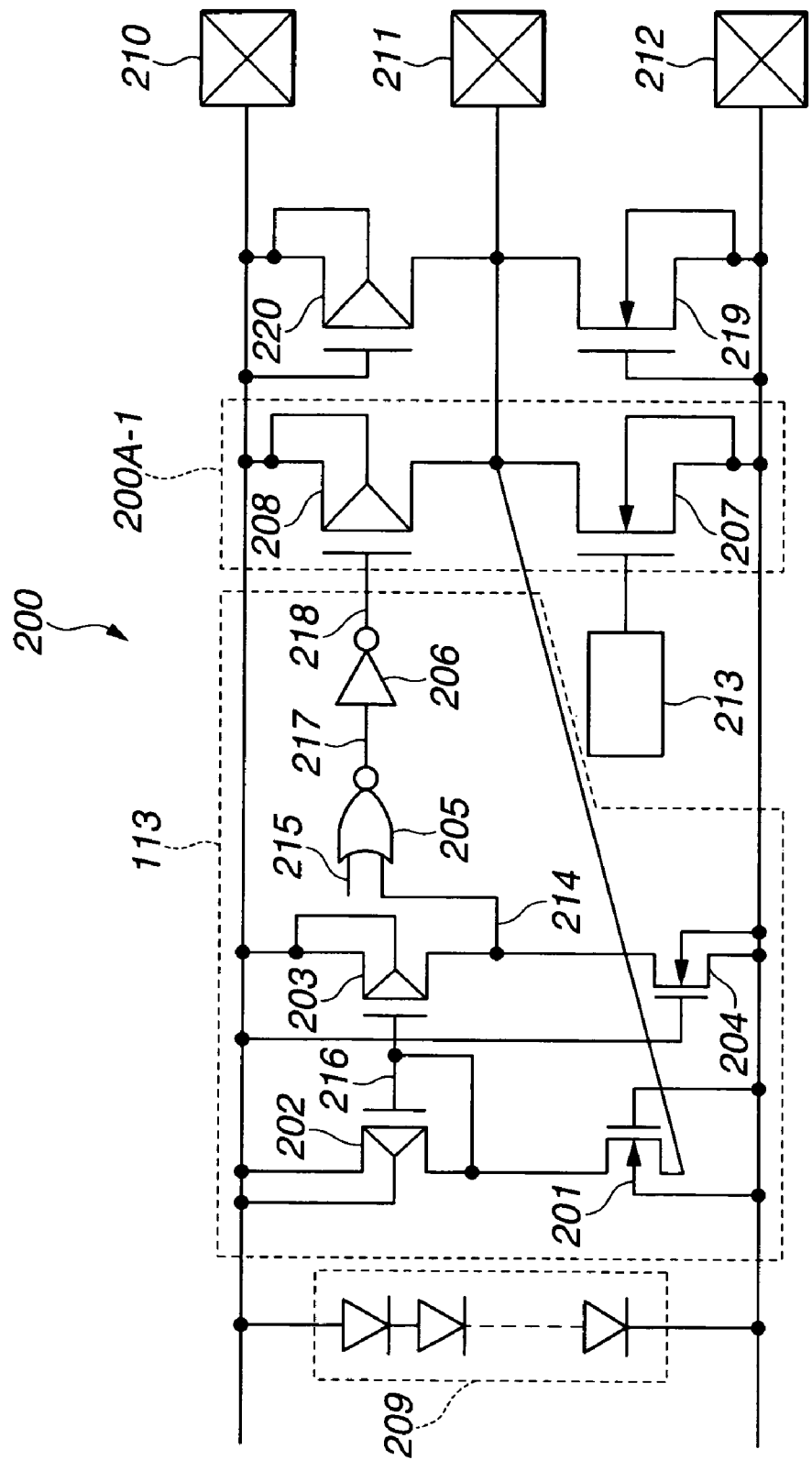
FIG. 5 is a circuit diagram showing the electrostatic protection circuit according to a second embodiment of the present invention.

The V DD terminal 110, I/O terminal 111, V SS terminal 112, buffer NMOSFET 107, buffer PMOSFET 108, GGNMOS 119, SGPMOS 120 and diode string 109 can be shared with (also used as) the V DD terminal 210, I/O terminal 211, V SS terminal 212, buffer NMOSFET 207, buffer PMOSFET 208, GGNMOS 219, SGPMOS 220 and diode string 209 of FIG. 5 even though reference numerals are different.

The PMOSFET 101, NMOSFET 102, NMOSFET 103 and PMOSFET 104 configure an amplifier. The drain terminal of the NMOSFET 102 is connected to the gate terminal thereof, and the source terminal and substrate terminal of the NMOS-FET 102 are connected to the V SS terminal 112. The gate terminal of the NMOSFET 103 is connected to the gate terminal and drain terminal of the NMOSFET 102, and the source terminal and substrate terminal of the NMOSFET 103 are connected to the V SS terminal 112. The gate terminal of the PMOSFET 104 is connected to the V SS terminal 112, the drain terminal of the PMOSFET 104 is connected to the drain terminal of the NMOSFET 103, and the source terminal and substrate terminal of the PMOSFET 104 are connected to the V DD terminal 110.

During normal operation, the NAND circuit 105 and inverter circuit 106 function as a pre-buffer circuit for controlling the potential of a gate terminal 118 of the buffer NMOSFET 107 according to a high or low level of a digital signal. During application of the electrostatic surge, the NAND circuit 105 and inverter circuit 106 function as a controller for controlling the gate potential of the buffer NMOSFET 107. One input terminal of the NAND circuit 105 is connected to the drain terminal of the NMOSFET 103, the other input terminal of the NAND circuit 105 is connected to a signal terminal 115 connected to the internal circuit (reference numeral 200 of FIG. 1), and an output terminal of the NAND circuit 105 is connected to the input terminal of the inverter circuit 106. The output terminal of the inverter circuit 106 is connected to the gate terminal of the buffer NMOSFET 107.

Furthermore, the NMOSFET 119 as the GGNMOS is connected in parallel between the drain and the source of the buffer NMOSFET 107. The drain terminal of the NMOSFET 119 is connected to the I/O terminal 111, and the gate terminal, source terminal and substrate terminal of the NMOSFET 119 are connected to the V SS terminal 112. The PMOSFET 120 as the SGPMOS is connected in parallel between the source and the drain of the buffer PMOSFET 108. The drain terminal of the PMOSFET 120 is connected to the I/O terminal 111, and the gate terminal, source terminal and substrate terminal of the PMOSFET 120 are connected to the V DD terminal 110.

Next, the operation of the electrostatic protection circuit of FIG. 2 will be described.

First, the operation when the electrostatic surge is applied will be described.

When the semiconductor device is transported before being incorporated into a system, the V DD terminal 110 and the V SS terminal 112 are not supplied with a high-level power supply voltage and a predetermined low-level power supply voltage respectively while the I/O terminal 111 is in a state of having no digital signal outputted thereto.

When the positive electrostatic surge is applied to the I/O terminal 111 with the V SS terminal 112 at the reference potential in such a no power supply state, a bias is applied, based on the potential of the electrostatic surge, to the diode string consisting of the (N+1) pieces of diode between the I/O terminal 111 and the V SS terminal 112 formed by a PN junction diode (not described) having the drain parasitic on the buffer PMOSFET 108 on the anode side and the diode string 109 consisting of the N pieces of diode. If the potential of the I/O terminal 111 is Vio, the potential of the V DD terminal 110 is V VDD and the potential of the V SS terminal 112 is V VSS, a magnitude relation of the potentials is Vio>V VDD>V VSS. If the number of stages of the diode string 109 is N stages, the voltage V VDD of the V DD terminal 110 is as follows.

$$V\,VDD = Vio \times N/(N+1)$$

Therefore, a potential difference occurs to a gate-source voltage Vgs of the PMOSFET 101. If Vio is boosted by the positive electrostatic surge until Vgs of the PMOSFET 101 exceeds a threshold voltage, the PMOSFET 101 is turned on. This turn-on means that the application of the electrostatic surge is detected.

As for the PMOSFET 101, NMOSFET 102, NMOSFET 103 and PMOSFET 104 configuring the amplifier, the PMOSFET 101 is turned on to have the source potential of the PMOSFET 101 applied to the gate terminals of the NMOS-FET 102 and NMOSFET 103 while the NMOSFET 103 is turned on to lower the potential of a node 114 and set it at the potential of the V SS terminal, that is, the low-level potential. Consequently, the controller consisting of the NAND circuit 105 and the inverter circuit 106 sets the potential of the gate terminal 118 of the buffer NMOSFET 107 at the potential V VSS of the V SS terminal, that is, the low-level potential.

Figure 3:
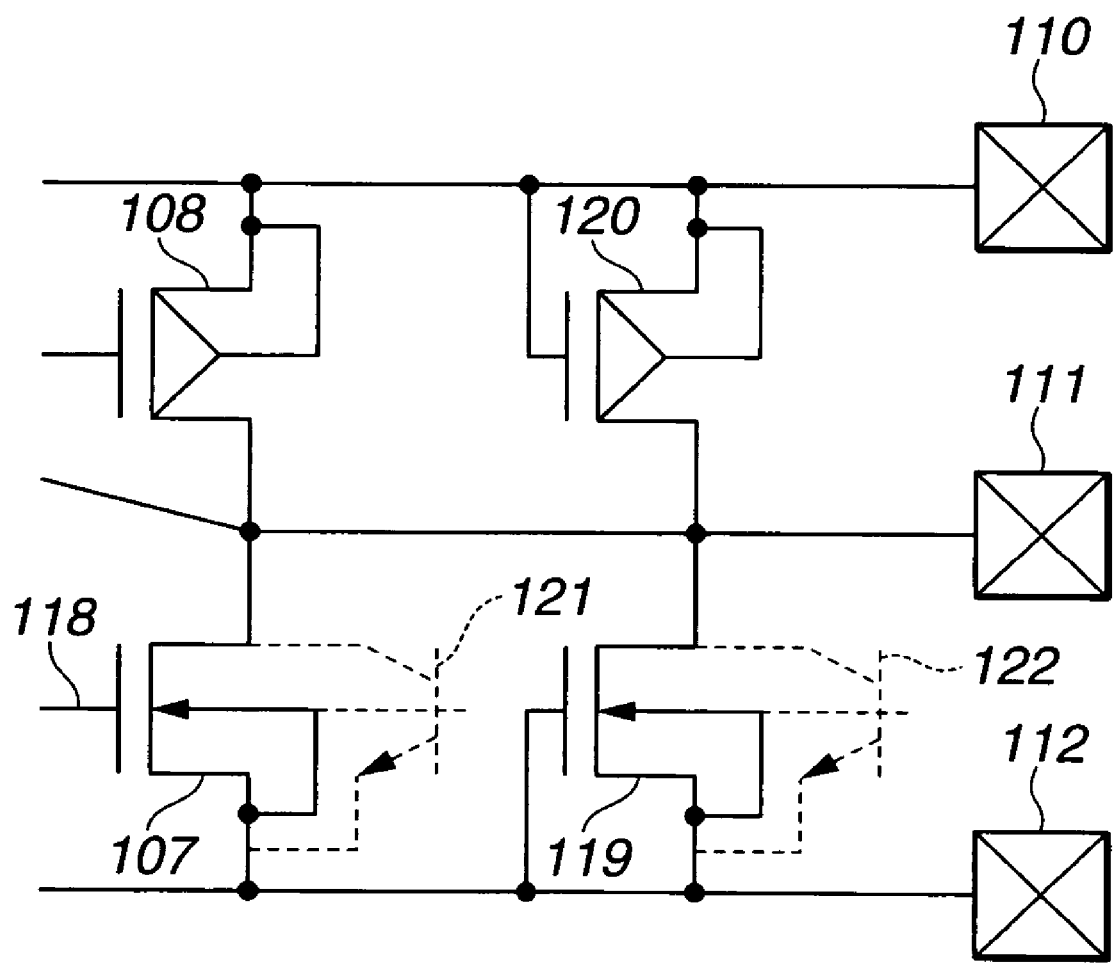
FIG. 3 is a diagram showing a parasitic bipolar transistor for discharging an electrostatic surge of FIG. 2.

If the gate terminal of the buffer NMOSFET 107 is set at the low level (V VSS), the buffer NMOSFET 107 is under the same bias condition as the grounded-gate GGNMOSFET 119 connected in parallel therewith. As shown in FIG. 3, the buffer NMOSFET 107 has an NPN-type parasitic BJT 121 formed thereon with a drain area as a collector, a substrate area as a base and a source area as an emitter, and the NMOSFET 119 has an NPN-type parasitic BJT 122 simultaneously formed thereon with a drain area as a collector, a substrate area as a base and a source area as an emitter.

When the high-voltage positive electrostatic surge is thus applied to the I/O terminal 111 with the V SS terminal 112 at the reference potential, the gate potential of the buffer NMOSFET 107 is set at the low-level potential so as to put the buffer NMOSFET 107 in a turn-off state. And if the voltage charged (accumulated) in the output circuit 100A-1 and boosted to a predetermined extent or higher by the high-voltage positive electrostatic surge having infiltrated from the I/O terminal 111 is applied to the drain, the NPN-type parasitic BJT 121 (refer to FIG. 3) of the buffer NMOSFET 107 is turned on. The electrostatic surge is discharged through the emitter connected to the source terminal from the collector connected to the drain terminal, and the NPN-type parasitic BJT 122 (refer to FIG. 3) of the NMOSFET 119 as the GGNMOS is simultaneously turned on. Thus, the electrostatic surge is discharged through the emitter connected to the source terminal from the collector connected to the drain terminal.

In the case where the high-voltage electrostatic surge is thus inputted, conduction of the buffer NMOSFET 107 as MOSFET operation is restricted as the gate potential of the buffer NMOSFET 107 is set at the low level as described above. Therefore, a discharged surge current passes by being divided approximately in two through the BJTs 121 and 122 formed on the NMOSFET 107 and NMOSFET 119 respectively so as to prevent the currents from gathering on the buffer NMOSFET 107 configuring the output buffer and eliminate a risk of leading the NMOSFET 107 to destruction.

Next, the operation during the normal operation will be described.

During the normal operation, the V DD terminal 110 and the V SS terminal 112 are supplied with the high-level power supply voltage V DD and the low-level power supply voltage V SS respectively from a power supply voltage supply circuit not shown while the I/O terminal 111 has the digital signal represented at a binary level of a high level and a low level outputted thereto. The gate terminal of the PMOSFET 101 has a high-level voltage supplied thereto, and the source terminal thereof is connected to the I/O terminal 111 so that a binary voltage of a high level and a low level is outputted. Therefore, the PMOSFET 101 is not turned on during the normal operation. Consequently, the node 114 is fixed at a high-level power supply potential (VDD) because the PMOSFET 104 is on. The pre-buffer circuit consisting of the NAND circuit 105 and inverter circuit 106 operates to control the potential of the gate terminal 118 of the buffer NMOSFET 107 according to the high or low level of the digital signal of the signal terminal 115 connected to the internal circuit (reference numeral 200 of FIG. 1). To be more specific, the node 114 is set at the high level during the normal operation, where the signal level of the gate terminal 118 of the buffer NMOSFET 107 is decided just by the logic (high level, low level) of the signal terminals 115 and 215.

The signal terminal 115 shown in FIG. 2 and the signal terminal 215 shown in FIG. 5 are supplied with the same digital signals from the same internal circuit (reference numeral 200 of FIG. 1). When the buffer NMOSFET 107 is turned on at the high level of the signal terminal 115 or 215 during the normal operation, the buffer PMOSFET 108 is turned off at the high level of the gate potential of the buffer PMOSFET 108, and the potential of the V SS terminal 112, that is, the low level is outputted from the I/O terminal 111. When the buffer NMOSFET 107 is turned off at the low level of the signal terminal 115 or 215, the buffer PMOSFET 108 is turned on, and the power supply potential (V DD) of the V DD terminal 110, that is, the high level is outputted from the I/O terminal 111.

During the normal operation, a node 116 is fixed at the low-level power supply potential V SS. In the case where the node 116 is boosted due to influence of noise and the like, however, the NMOSFET 102 is turned on and operates to lower the potential of the node 116 and fix the NMOSFET 103 as off. For that reason, the node 114 maintains a high-level potential so that there is no risk of a malfunction during the normal operation.

It is also possible, though not shown, to insert a resistance between the node 116 and the V SS terminal 112 in order to further reduce the influence of the noise over the node 116. The resistance may be formed by an active resistor consisting of the NMOSFET having the gate terminal connected to the V DD terminal 110, the source terminal and substrate terminal connected to the V SS terminal 112 and the drain terminal connected to the node 116.

Figure 4:
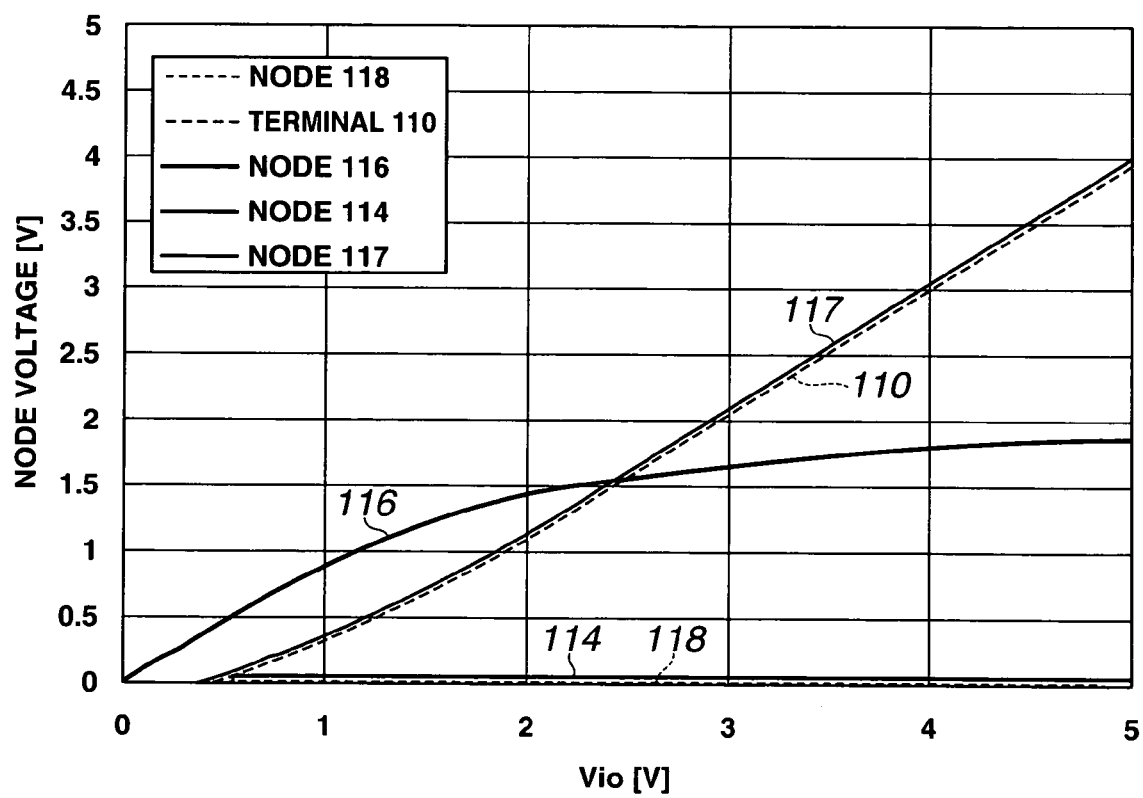
FIG. 4 is a graph showing I/O terminal potential (Vio) dependency of node voltages when a positive electrostatic surge is inputted to an I/O terminal in FIG. 2.

FIG. 4 is a graph showing the I/O terminal potential (Vio) dependency of node voltages when the positive electrostatic surge is inputted to the I/O terminal in FIG. 2.

FIG. 4 has the Vio dependency of the node voltages acquired by circuit simulation. It is to be understood that, in the case where the potential of Vio increases to a fixed extent or more due to the electrostatic surge, the voltage of the gate terminal 118 of the buffer NMOSFET 107 is fixed at the potential of the V SS terminal, that is, the low-level potential (low level).

The above first embodiment of FIG. 2 describes the case where the positive electrostatic surge is applied to the I/O terminal 111 with the V SS terminal 112 at the reference potential. However, the first embodiment of FIG. 2 is also applicable to the case where a negative electrostatic surge is applied to the V SS terminal 112 with the I/O terminal 111 at the reference potential. If the potential of the I/O terminal 111 is Vio, the potential of the V DD terminal 110 is V VDD and the potential of the V SS terminal 112 is V VSS in this case, the magnitude relation of the potentials is Vio>V VDD>V VSS. As previously described, it is possible to set the potential of the gate terminal of the buffer NMOSFET 107 at the low-level potential (low level) and turn off the buffer NMOSFET 107 so as to prevent the currents of the electrostatic surge from gathering on and passing through the buffer NMOSFET 107.

Second Embodiment

FIG. 5 is a circuit diagram showing the electrostatic protection circuit according to the second embodiment of the present invention.

The electrostatic protection circuit 200 shown in FIG. 5 includes a buffer NMOSFET 207 and a buffer PMOSFET 208 as the output buffers configuring an output circuit 200A-1. The electrostatic protection circuit 200 realizes the electrostatic protection function against the electrostatic surge in conjunction with the other circuit elements (a V DD terminal 210, the I/O terminal 211, a V SS terminal 212, NMOSFETs 201, 204, PMOSFETs 202, 203, an NOR circuit 205, an inverter circuit 206, a diode string 209, a buffer NMOSFET control circuit 213, a GGNMOS 219 and an SGPMOS 220).

The second embodiment shows the electrostatic protection circuit which has the V DD terminal 210 at a reference potential in a state of having no power supply voltage applied to the VDD terminal 210 and V SS terminal 212, prevents the overcurrent from passing through the buffer PMOSFET 208 as the output buffer and destroying it when a negative electrostatic surge is applied to the I/O terminal 211 and further allows the electrostatic surge to be discharged.

The V DD terminal 210 represents a first power supply terminal on the high-level side, the I/O terminal 211 represents an input-output terminal for an external connection, and the V SS terminal 212 represents a second power supply terminal on the low-level side.

The buffer NMOSFET 207 is the output buffer for pulling down the potential of the I/O terminal 211 to the potential of the V SS terminal 212. The buffer NMOSFET 207 has a source terminal and a substrate terminal thereof connected to the V SS terminal 212 and a drain terminal thereof connected to the I/O terminal 211.

The buffer PMOSFET 208 is the output buffer for pulling up the potential of the I/O terminal 211 to the potential of the V DD terminal 210. The buffer PMOSFET 208 has a source terminal and a substrate terminal thereof connected to the V DD terminal 210 and a drain terminal thereof connected to the I/O terminal 211.

The buffer NMOSFET control circuit 213 is configured by the PMOSFET 101, NMOSFET 102, NMOSFET 103, PMOSFET 104, NAND circuit 105 and inverter circuit 106 shown in FIG. 2, and the functions thereof are described in the first embodiment in FIG. 2. In the case where the negative electrostatic surge is applied to the I/O terminal 211 with the V DD terminal 210 at the reference potential in the state of having no power supply voltage applied to the V DD terminal 210 and V SS terminal 212, the buffer NMOSFET control circuit 213 does not operate and is not directly involved in electrostatic surge protection operation by the buffer PMOSFET 208. For this reason, a detailed configuration of the buffer NMOSFET control circuit 213 is omitted in the second embodiment in order to render the main configuration of FIG. 5 easy to see.

The NMOSFET 201 functions as a detector for detecting the electrostatic surge. The gate terminal of the NMOSFET 201 is connected to the V SS terminal 212, the source terminal of the NMOSFET 201 is connected to the I/O terminal 211, and the substrate terminal of the NMOSFET 201 is connected to the V SS terminal 212.

The diode string 209 as a rectifying element is connected between the V DD terminal 210 and V SS terminal 212. The diode string 209 is configured by connecting N pieces (N is a positive integer) of diode in series.

The V DD terminal 210, I/O terminal 211, V SS terminal 212, buffer NMOSFET 207, buffer PMOSFET 208, GGNMOS 219, SGPMOS 220 and diode string 209 can be shared with (also used as) the V DD terminal 110, I/O terminal 111, V SS terminal 112, buffer NMOSFET 107, buffer PMOSFET 108, GGNMOS 119, SGPMOS 120 and diode string 109 of FIG. 1 even though reference numerals are different.

The NMOSFET 201, PMOSFET 202, PMOSFET 203 and NMOSFET 204 configure an amplifier. The drain terminal of the PMOSFET 202 is connected to the gate terminal thereof, and the source terminal and substrate terminal thereof are connected to the V DD terminal 210. The gate terminal of the PMOSFET 203 is connected to the gate terminal and drain terminal of the PMOSFET 202, and the source terminal and substrate terminal of the PMOSFET 203 are connected to the V DD terminal 210. The gate terminal of the NMOSFET 204 is connected to the V DD terminal 210, the drain terminal of the NMOSFET 204 is connected to the drain terminal of the PMOSFET 203, and the source terminal and substrate terminal of the NMOSFET 204 are connected to the V SS terminal 212.

During normal operation, the NOR circuit 205 and inverter circuit 206 function as a pre-buffer circuit for controlling the potential of a gate terminal 218 of the buffer PMOSFET 208 according to a high or low level of a digital signal. During application of the electrostatic surge, the NOR circuit 205 and inverter circuit 206 function as a controller for controlling the gate potential of the buffer PMOSFET 208. One input terminal of the NOR circuit 205 is connected to the drain terminal of the PMOSFET 203, the other input terminal of the NOR circuit 205 is connected to a signal terminal 215 connected to the internal circuit (reference numeral 200 of FIG. 1), and an output terminal of the NOR circuit 205 is connected to the input terminal of the inverter circuit 206. The output terminal of the inverter circuit 206 is connected to the gate terminal of the buffer PMOSFET 208.

Furthermore, the NMOSFET 219 as the GGNMOS is connected in parallel between the drain and the source of the buffer NMOSFET 207. The drain terminal of the NMOSFET 219 is connected to the I/O terminal 211, and the gate terminal, source terminal and substrate terminal of the NMOSFET 219 are connected to the V SS terminal 212. The PMOSFET 220 as the SGPMOS is connected in parallel between the source and the drain of the buffer PMOSFET 208. The drain terminal of the PMOSFET 220 is connected to the I/O terminal 211, and the gate terminal, source terminal and substrate terminal of the PMOSFET 220 are connected to the V DD terminal 210.

Next, the operation of the electrostatic protection circuit of FIG. 5 will be described.

First, the operation when the electrostatic surge is applied will be described.

When the semiconductor device is transported before being incorporated into a system, the V DD terminal 210 and the V SS terminal 212 are not supplied with a high-level power supply voltage and a low-level power supply voltage respectively while the I/O terminal 211 is in a state of having no digital signal outputted thereto.

When the negative electrostatic surge is applied to the I/O terminal 211 with the V DD terminal 210 at the reference potential in such a no power supply state, a bias is applied, based on the potential of the electrostatic surge, to the diode string consisting of the (N+1) pieces of diode between the VDD terminal 210 and the I/O terminal 211 formed by a PN junction diode (not described) having the drain parasitic on the buffer NMOSFET 207 on the cathode side and the diode string 209 consisting of the N pieces of diode. If the potential of the I/O terminal 211 is Vio, the potential of the V DD terminal 210 is V VDD and the potential of the V SS terminal 212 is V VSS, a relative magnitude relation of the potentials is V VDD>V VSS>Vio. If the number of stages of the diode string 209 is N stages, the voltage V VSS of the V SS terminal 212 is as follows.

$$V\ VSS = Vio \times N/(N+1)$$

Therefore, a potential difference occurs to a gate-source voltage Vgs of the NMOSFET 201 as the detector. If Vio is lowered by the negative electrostatic surge until Vgs of the NMOSFET 201 exceeds a threshold voltage, the NMOSFET 201 is turned on. This turn-on means that the application of the electrostatic surge is detected.

As for the NMOSFET 201, PMOSFET 202, PMOSFET 203 and NMOSFET 205 configuring the amplifier, the NMOSFET 201 is turned on to have the source potential thereof applied to the gate terminals of the PMOSFETs 202 and 203 while the PMOSFET 203 is turned on to increase the potential of a node 214 and set it at the potential of the V DD terminal, that is, the high-level potential (high level). Consequently, the controller consisting of the NOR circuit 205 and the inverter circuit 206 sets the potential of the gate terminal 218 of the buffer PMOSFET 208 at the potential of the V DD terminal, that is, the high-level potential (high level).

Figure 6:
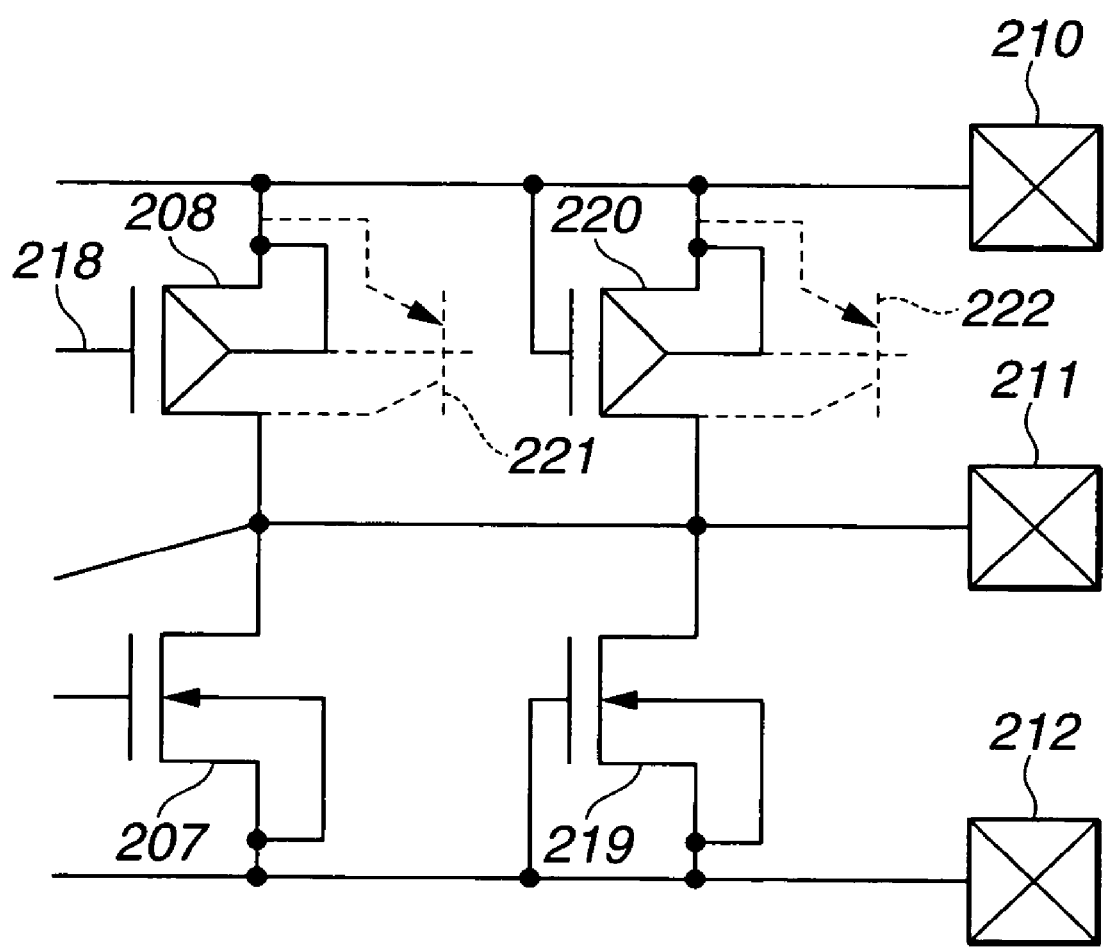
FIG. 6 is a diagram showing the parasitic bipolar transistor for discharging the electrostatic surge of FIG. 2.

If the gate terminal of the buffer PMOSFET 208 is set at the high level (V DD), the buffer PMOSFET 208 is under the same bias condition as the source gate connection type SGPMOSFET 220 connected in parallel therewith. As shown in FIG. 6, the buffer PMOSFET 208 has a PNP-type parasitic BJT 221 formed thereon with a source area as an emitter, a substrate area as a base and a drain area as a collector, and the PMOSFET 220 has a PNP-type parasitic BJT 222 simultaneously formed thereon with a source area as an emitter, a substrate area as a base and a drain area as a collector.

When the high-voltage negative electrostatic surge is thus applied to the I/O terminal 211 with the V DD terminal 210 at the reference potential, the gate potential of the buffer PMOSFET 208 is set at the high-level potential and the gate terminal 218 of the buffer PMOSFET 208 is thereby controlled to put the buffer PMOSFET 208 in a turn-off state. Consequently, if the voltage charged (accumulated) in the output circuit 200A-1 and lowered to a predetermined extent or lower by the high-voltage negative electrostatic surge having infiltrated from the I/O terminal 211 is applied to the drains of the buffer PMOSFET 208 and PMOSFET 220, the PNP-type parasitic BJT 221 (refer to FIG. 6) of the buffer PMOSFET 208 is turned on. The electrostatic surge is discharged from the drain terminal through the source terminal, and the PNP-type parasitic BJT 222 (refer to FIG. 6) of the PMOSFET 220 configuring the SGPMOS is simultaneously turned on. Thus, the electrostatic surge is discharged from the drain terminal through the source terminal.

In the case where the high-voltage electrostatic surge is thus inputted, conduction of the buffer PMOSFET 208 as MOSFET operation is restricted as the gate potential of the buffer PMOSFET 208 is set at the high level as described above. Therefore, a discharged surge current passes by being divided approximately in two through the parasitic BJTs 221 and 222 formed on the PMOSFET 208 and PMOSFET 220 respectively so as to prevent the currents from gathering on the buffer POSFET 208 configuring the output buffer and eliminate a risk of leading the PMOSFET 208 to destruction.

Next, the operation during the normal operation will be described.

During the normal operation, the V DD terminal 210 is supplied with the high-level power supply voltage and the V SS terminal 212 is supplied with the low-level power supply voltage while the I/O terminal 211 has the digital signal at a binary level of a high level and a low level outputted thereto. The gate terminal of the NMOSFET 201 has a low-level power supply potential supplied thereto, and the source terminal thereof is connected to the I/O terminal 211 so that a binary voltage of a high level and a low level is outputted. Therefore, the NMOSFET 201 is not turned on during the normal operation. Consequently, the node 214 is fixed at a low-level potential (low level) because the NMOSFET 204 is on. The pre-buffer circuit consisting of the NOR circuit 205 and inverter circuit 206 operates to control the potential of the gate terminal 218 of the buffer PMOSFET 208 according to the high or low level of the digital signal of the signal terminal 215 connected to the internal circuit (reference numeral 200 of FIG. 1). To be more specific, the node 214 is set at the low level during the normal operation, where the signal level of the gate terminal 218 of the buffer PMOSFET 208 is decided just by the logic (high level, low level) of the signal terminals 215 and 115.

The signal terminal 215 shown in FIG. 5 and the signal terminal 115 shown in FIG. 2 are supplied with the same digital signal output from the same internal circuit (reference numeral 200 of FIG. 1). When the buffer PMOSFET 208 is turned on at the low level of the signal terminal 215 or 115 during the normal operation, the buffer NMOSFET 207 is turned off, and the high level is outputted from the I/O terminal 211. When the buffer PMOSFET 208 is turned off at the high level of the signal terminal 115 or 215, the buffer NMOSFET 207 is turned on, and the low level is outputted from the I/O terminal 211.

During the normal operation, a node 216 is fixed at the high-level potential V DD. In the case where the node 216 is stepped down due to influence of noise and the like, however, the PMOSFET 202 is turned on and operates to increase the potential of the node 216 and fix the PMOSFET 203 as off. For that reason, the node 214 maintains a low-level potential so that there is no risk of a malfunction.

It is also possible, though not shown, to insert a resistance between the node 216 and the V DD terminal 210 in order to further reduce the influence of the noise over the node 216. The resistance may be formed by an active resistor consisting of the PMOSFET having the gate terminal connected to the V SS terminal 212, the source terminal and substrate terminal connected to the V DD terminal 210 and the drain terminal connected to the node 216.

A simulation result of the circuit shown in FIG. 5 is omitted. It is possible, as shown in FIG. 4, to control the gate potential of the buffer PMOSFET 208. In the case where the negative electrostatic surge is applied to the I/O terminal 211 with the V DD terminal 210 at the reference potential and the potential of Vio lowers, however, the potential of the gate terminal 218 of the buffer PMOSFET 208 is set at the potential of the V DD terminal, that is, the high-level potential (high level).

The above second embodiment of FIG. 5 describes the case where the negative electrostatic surge is applied to the I/O terminal 211 with the V DD terminal 210 at the reference potential. However, the second embodiment of FIG. 5 is also applicable to the case where the positive electrostatic surge is applied to the V DD terminal 210 with the I/O terminal 211 at the reference potential. If the potential of the I/O terminal 211 is Vio, the potential of the V DD terminal 210 is V VDD and the potential of the V SS terminal 212 is V VSS in this case, the magnitude relation of the potentials is V VDD>V VSS>Vio. As previously described, it is possible to set the potential of the gate terminal of the buffer PMOSFET 208 at the high-level potential (high level) and turn off the buffer PMOSFET 208 so as to prevent the currents of the electrostatic surge from gathering on and passing through the buffer POSFET 208.

The electrostatic protection circuit of the first embodiment of FIG. 2 has a configuration capable of protecting the buffer MOSFET according to the following two electrostatic surge modes. (1) When the positive electrostatic surge is applied to the I/O terminal with the V SS terminal at the reference potential, and (2) when the negative electrostatic surge is applied to the V SS terminal with the I/O terminal at the reference potential. The electrostatic protection circuit of the second embodiment of FIG. 5 has a configuration capable of protecting the buffer MOSFET according to the following two electrostatic surge modes. (3) When the negative electrostatic surge is applied to the I/O terminal with the V DD terminal at the reference potential, and (4) when the positive electrostatic surge is applied to the V DD terminal with the I/O terminal at the reference potential. Therefore, it is possible to configure the electrostatic protection circuit of FIG. 2 and the electrostatic protection circuit of FIG. 5 integrally so as to have a configuration capable of protecting the buffer MOSFET according to the four electrostatic surge modes of (1) to (4).

Third Embodiment

Figure 7:
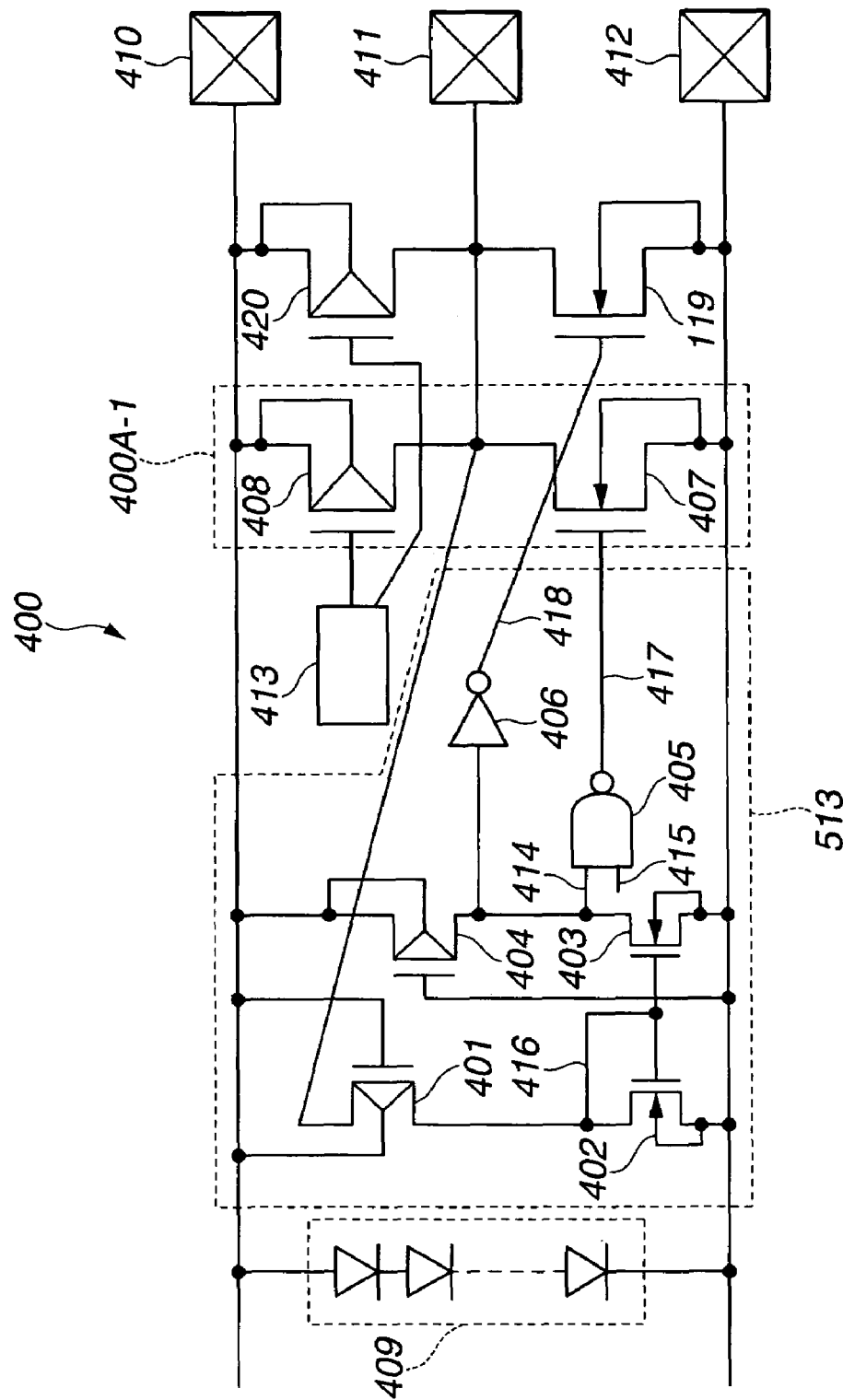
FIG. 7 is a circuit diagram showing the electrostatic protection circuit according to a third embodiment of the present invention.

FIG. 7 is a circuit diagram showing the electrostatic protection circuit according to the third embodiment of the present invention.

Reference numerals 400 to 420 of the third embodiment in FIG. 7 correspond to reference numerals 100 to 120 of the first embodiment in FIG. 2.

An electrostatic protection circuit 400 shown in FIG. 7 includes a buffer NMOSFET 407 and a buffer PMOSFET 408 as the output buffers configuring an output circuit 400A-1. The electrostatic protection circuit 400 realizes the electrostatic protection function against the electrostatic surge in conjunction with the other circuit elements (a V DD terminal 410, an I/O terminal 411, a V SS terminal 412, PMOSFETs 401, 404, NMOSFETs 402, 403, an NAND circuit 405, an inverter circuit 406, a diode string 409, a buffer NMOSFET control circuit 413, a GGNMOS 419 and an SGPMOS 420).

The differences in configuration between the third embodiment of FIG. 7 and the first embodiment of FIG. 2 are as follows. To be more specific, in FIG. 2, the NAND circuit 105 and inverter circuit 106 lie between the drain terminal of the NMOSFET 103 (drain terminal of the PMOSFET 104 in other words) and the gate terminal of the buffer NMOSFET 107. In FIG. 7, however, only the NAND circuit 405 lies between the drain terminal of the NMOSFET 403 (drain terminal of the PMOSFET 404 in other words) and the gate terminal of the buffer NMOSFET 407. In FIG. 2, nothing is connected between the drain terminal of the NMOSFET 103 (drain terminal of the PMOSFET 104 in other words) and the gate terminal of the NMOSFET 119. In FIG. 7, however, inverter circuit 406 lies between the drain terminal of the NMOSFET 403 (drain terminal of the PMOSFET 404 in other words) and the gate terminal of the NMOSFET 419. The NMOSFET 419 connected in parallel with the buffer NMOSFET 407 between the I/O terminal 411 and the V SS terminal 412 has a function of being turned on as the MOSFET operation on input of the electrostatic surge and discharging the electrostatic surge.

Figure 8:
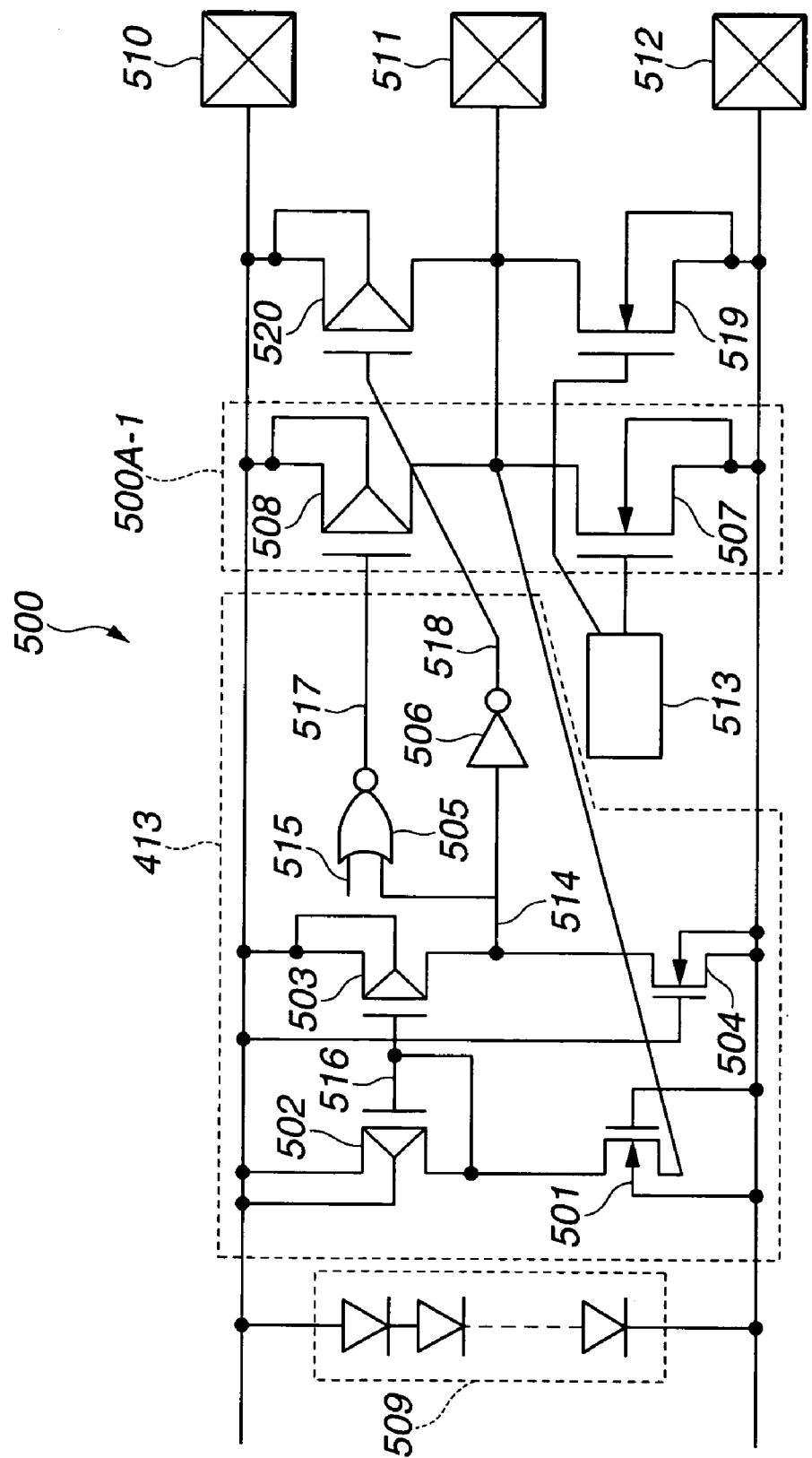
FIG. 8 is a circuit diagram showing the electrostatic protection circuit according to a fourth embodiment of the present invention.

The buffer PMOSFET control circuit 413 is configured by an NMOSFET 501, a PMOSFET 502, a PMOSFET 503, an NMOSFET 504, an NOR circuit 505 and an inverter circuit 506 shown in FIG. 8, and the functions thereof are the same as the buffer PMOSFET control circuit 113 of the first embodiment in FIG. 2. In the case where the positive electrostatic surge is applied to the I/O terminal 411 with the V SS terminal 412 at the reference potential in the state of having no power supply voltage applied to the V DD terminal 410 and V SS terminal 412, the buffer PMOSFET control circuit 413 does not operate and is not directly involved in electrostatic surge protection operation by the buffer NMOSFET 407. For this reason, a detailed configuration of the buffer PMOSFET control circuit 413 is omitted in the third embodiment in order to render the main configuration of FIG. 7 easy to see.

The V DD terminal 410, I/O terminal 411, V SS terminal 412, buffer NMOSFET 407, buffer PMOSFET 408, GGNMOS 419, SGPMOS 420 and diode string 409 can be shared with (also used as) a V DD terminal 510, an I/O terminal 511, a V SS terminal 512, a buffer NMOSFET 507, a buffer PMOSFET 508, a GGNMOS 519, a SGPMOS 520 and a diode string 509 of FIG. 8 even though reference numerals are different.

Next, the operation of the third embodiment in FIG. 7 will be described in contrast with the operation of the first embodiment in FIG. 2.

According to the first embodiment in FIG. 2, when the positive electrostatic surge is applied to the I/O terminal 111 with the V SS terminal 112 at the reference potential, the gate potential of the buffer NMOSFET 107 is set at the low-level potential (low-level V SS) and the buffer NMOSFET 107 is turned off as the MOSFET operation so as to prevent the surge currents from gathering on the buffer NMOSFET 107 and leading to destruction.

According to the circuit shown in the third embodiment in FIG. 7 in comparison, when the positive electrostatic surge is applied to the I/O terminal 411 with the V SS terminal 412 at the reference potential, the gate potential of the buffer NMOSFET 407 is set at the high-level potential (V DD) and the gate potential of the NMOSFET 419 intended only for discharge of the electrostatic surge and not used for potential control of the I/O terminal 411 is simultaneously set at the high-level potential (V DD). It is thereby possible to turn on the buffer NMOSFET 407 and NMOSFET 419 simultaneously as the MOSFET operation and distribute and discharge the surge currents almost equally between the two NMOSFETs 407 and 419 so as to prevent the surge currents from gathering on the buffer NMOSFET 407 and leading to destruction. In addition, if the positive electrostatic surge is inputted from the I/O terminal 411 and drain voltages of the two NMOSFETs 407 and 419 are boosted by charging thereof, the parasitic BJTs of the NMOSFETs (equivalent to reference numerals 121 and 122 of FIG. 3) are turned on and contribute to the discharge of the surge currents as described in FIG. 3. When the two NMOSFETs 407 and 419 are given the high-level potential (high level) to their respective gate terminals and turned on as the MOSFET operation, their thresholds in that case are lower than the thresholds on turning on the respective parasitic BJTs of the NMOSFETs 407 and 419. Therefore, the two NMOSFETs 407 and 419 are turned on as the MOSFET operation first, and then the respective parasitic BJTs of the NMOSFETs 407 and 419 are turned on as the voltage charged by the positive electrostatic surge is boosted.

Detailed circuit operation will be omitted because it is easily guessable from the description of the first embodiment.

The above third embodiment of FIG. 7 describes the case where the positive electrostatic surge is applied to the I/O terminal 411 with the V SS terminal 412 at the reference potential. However, the third embodiment of FIG. 7 is also applicable to the case where the negative electrostatic surge is applied to the V SS terminal 412 with the I/O terminal 411 at the reference potential. If the potential of the I/O terminal 411 is Vio, the potential of the V DD terminal 410 is V VDD and the potential of the V SS terminal 412 is V VSS in this case, the magnitude relation of the potentials is Vio>V VDD>V VSS. As previously described, it is possible to set the potentials of the gate terminals 417 and 418 of the buffer NMOSFET 407 and the NMOSFET 419 for discharge of the electrostatic surge at the high-level potentials (high level) and turn on both the buffer NMOSFET 407 and the NMOSFET 419 for discharge of the electrostatic surge to have the electrostatic surge currents divided in two and flow so as to prevent the currents of the electrostatic surge from flowing and gathering on the buffer NMOSFET 407 as the output buffer and prevent the buffer NMOSFET 407 from being destroyed.

Fourth Embodiment

FIG. 8 is a circuit diagram showing the electrostatic protection circuit according to a fourth embodiment of the present invention.

Reference numerals 500 to 520 of the fourth embodiment in FIG. 8 correspond to reference numerals 200 to 220 of the second embodiment in FIG. 5.

An electrostatic protection circuit 500 shown in FIG. 8 includes a buffer NMOSFET 507 and a buffer PMOSFET 508 as the output buffers configuring an output circuit 500A-1. The electrostatic protection circuit 500 realizes the electrostatic protection function against the electrostatic surge in conjunction with the other circuit elements (a V DD terminal 510, an I/O terminal 511, a V SS terminal 512, NMOSFETs 501, 504, PMOSFETs 502, 503, an NOR circuit 505, an inverter circuit 506, a diode string 509, a buffer NMOSFET control circuit 513, a GGNMOS 519 and an SGPMOS 520).

The differences in configuration between the fourth embodiment of FIG. 8 and the second embodiment of FIG. 5 are as follows. To be more specific, in FIG. 5, the NOR circuit 205 and inverter circuit 206 lie between the drain terminal of the PMOSFET 203 (drain terminal of the NMOSFET 204 in other words) and the gate terminal of the buffer PMOSFET 208. In FIG. 8, however, only the NOR circuit 505 lies between the drain terminal of the PMOSFET 503 (drain terminal of the NMOSFET 504 in other words) and the gate terminal of the buffer PMOSFET 508. In FIG. 5, nothing is connected between the drain terminal of the PMOSFET 203 (drain terminal of the NMOSFET 204 in other words) and the gate terminal of the PMOSFET 219. In FIG. 8, however, the inverter circuit 506 lies between the drain terminal of the PMOSFET 503 (drain terminal of the NMOSFET 504 in other words) and the gate terminal of the PMOSFET 520. The PMOSFET 520 connected in parallel with the buffer PMOSFET 508 between the V DD terminal 510 and the I/O terminal 511 has a function of being turned on as the MOSFET operation on input of the electrostatic surge and discharging the electrostatic surge.

The buffer NMOSFET control circuit 513 is configured by the PMOSFET 401, NMOSFET 402, NMOSFET 403, PMOSFET 404, NAND circuit 405 and inverter circuit 406 shown in FIG. 7, and the functions thereof are the same as the buffer NMOSFET control circuit 213 of the second embodiment in FIG. 5. In the case where the negative electrostatic surge is applied to the I/O terminal 511 with the V DD terminal 510 at the reference potential in the state of having no power supply voltage applied to the V DD terminal 510 and V SS terminal 512, the buffer NMOSFET control circuit 513 does not operate and is not directly involved in electrostatic surge protection operation by the buffer PMOSFET 508. For this reason, a detailed configuration of the buffer NMOSFET control circuit 513 is omitted in the fourth embodiment in order to render the main configuration of FIG. 8 easy to see.

The V DD terminal 510, I/O terminal 511, V SS terminal 512, buffer NMOSFET 507, buffer PMOSFET 508, GGN-MOS 519, SGPMOS 520 and diode string 509 can be shared with (also used as) the V DD terminal 410, an I/O terminal 411, a V SS terminal 412, buffer NMOSFET 407, buffer PMOSFET 408, GGNMOS 419, SGPMOS 420 and diode string 409 of FIG. 7 even though reference numerals are different.

Next, the operation of the fourth embodiment in FIG. 8 will be described in contrast with the operation of the second embodiment in FIG. 5.

According to the second embodiment in FIG. 5, when the negative electrostatic surge is applied to the I/O terminal 211 with the V DD terminal 210 at the reference potential, the gate potential of the buffer PMOSFET 208 is set at the high-level potential (V DD) and the buffer PMOSFET 208 is turned off as the MOSFET operation so as to prevent the surge currents from gathering on the buffer PMOSFET 208 and leading to destruction.

According to the circuit shown in the fourth embodiment in FIG. 8 in comparison, when the negative electrostatic surge is applied to the I/O terminal 511 with the V DD terminal 510 at the reference potential, the gate potential of the buffer PMOSFET 508 is set at the low-level potential (V SS) and the gate potential of the PMOSFET 520 intended only for discharge of the electrostatic surge and not used for potential control of the I/O terminal 511 is simultaneously set at the low-level potential (V SS). It is thereby possible to turn on the buffer PMOSFET 508 and PMOSFET 520 simultaneously as the MOSFET operation and distribute and discharge the surge currents almost equally between the two PMOSFET 508 and PMOS-FET 520 so as to prevent the surge currents from gathering on the buffer PMOSFET 508 and leading to destruction. In addition, if the positive electrostatic surge is inputted from the I/O terminal 511 and drain voltages of the two PMOSFET 508 and PMOSFET 520 are boosted by charging thereof, the parasitic BJTs of the PMOSFETs (equivalent to reference numerals 221 and 222 of FIG. 6) are turned on and contribute to the discharge of the surge currents as described in FIG. 6. When the two PMOSFETs 508 and 520 are given the low-level potential (low level) to their respective gate terminals and turned on as the MOSFET operation, their thresholds in that case are higher than the thresholds on turning on the respective parasitic BJTs of the two PMOSFETs 508 and 520. Therefore, the two PMOSFETs 508 and 520 are turned on as the MOSFET operation first, and then the respective parasitic BJTs of the two PMOSFETs 508 and 520 are turned on as the voltage charged by the negative electrostatic surge is stepped down.

Detailed circuit operation will be omitted because it is easily guessable from the description of the second embodiment.

The above fourth embodiment of FIG. 8 describes the case where the negative electrostatic surge is applied to the I/O terminal 511 with the V DD terminal 510 at the reference potential. However, the fourth embodiment of FIG. 8 is also applicable to the case where the positive electrostatic surge is applied to the V DD terminal 510 with the I/O terminal 511 at the reference potential. If the potential of the I/O terminal 511 is Vio, the potential of the V DD terminal 510 is V VDD and the potential of the V SS terminal 512 is V VSS in this case, the magnitude relation of the potentials is V VDD>V VSS>Vio. As previously described, it is possible to set the potentials of the gate terminals 517 and 518 of the buffer PMOSFET 508 and the PMOSFET 520 for discharge of the electrostatic surge at the low-level potentials (low level) and turn on both the PMOSFET 508 and the PMOSFET 520 for discharge of the electrostatic surge so as to prevent the currents of the electrostatic surge from gathering on the PMOSFET 508 as the output buffer and prevent the buffer the PMOSFET 508 from being destroyed.

The electrostatic protection circuit of the third embodiment of FIG. 7 has a configuration capable of protecting the buffer MOSFET according to the following two electrostatic surge modes. (1) When the positive electrostatic surge is applied to the I/O terminal with the V SS terminal at the reference potential, and (2) when the negative electrostatic surge is applied to the V SS terminal with the I/O terminal at the reference potential. The electrostatic protection circuit of the fourth embodiment of FIG. 8 has a configuration capable of protecting the buffer MOSFET according to the following two electrostatic surge modes. (3) When the negative electrostatic surge is applied to the I/O terminal with the V DD terminal at the reference potential, and (4) when the positive electrostatic surge is applied to the V DD terminal with the I/O terminal at the reference potential. Therefore, it is possible to configure the electrostatic protection circuit of FIG. 7 and the electrostatic protection circuit of FIG. 8 integrally so as to have a configuration capable of protecting the buffer MOSFET according to the four electrostatic surge modes of (1) to (4).

Having described the preferred embodiments of the invention referring to the accompanying drawings, it should be understood that the present invention is not limited to those precise embodiments and various changes and modifications thereof could be made bar one skilled in the art without departing from the spirit or scope of the invention as defined in the appended claims.

What is claimed is:

1. An electrostatic protection circuit comprising:
   a first power supply terminal;
   a second power supply terminal;
   an input-output terminal for an external connection;
   a P-type MOSFET for a buffer for pulling up a potential of the input-output terminal to the potential of the first power supply terminal;
   an N-type MOSFET for the buffer for pulling down the potential of the input-output terminal to the potential of the second power supply terminal;
   a rectifying element having an anode terminal connected to the first power supply terminal and a cathode terminal connected to the second power supply terminal;
   a detector for comparing the potential of the input-output terminal to the potential of the first power supply terminal or comparing the potential of the input-output terminal to the potential of the second power supply terminal to detect whether or not an electrostatic surge is flowing into the input-output terminal; and
   a controller for controlling a gate potential of one of the N-type MOSFET for the buffer and P-type MOSFET for the buffer when the detector detects inflow of the electrostatic surge and turning off the MOSFET for the buffer of which gate potential is controlled out of the N-type MOSFET for the buffer and P-type MOSFET for the buffer.

2. The electrostatic protection circuit according to claim 1, wherein:
the detector compares the potential of the input-output terminal to the potential of the first power supply terminal; and
in the case where the potential of the input-output terminal is higher as a result of the comparison made by the detector, the controller controls the gate potential of the N-type MOSFET for the buffer to a low-level potential and turns off the N-type MOSFET for the buffer.

3. The electrostatic protection circuit according to claim 1, wherein:
the detector compares the potential of the input-output terminal to the potential of the second power supply terminal; and
in the case where the potential of the second power supply terminal is higher as a result of the comparison made by the detector, the controller controls the gate potential of the P-type MOSFET for the buffer to a high-level potential and turns off the P-type MOSFET for the buffer.

4. The electrostatic protection circuit according to claim 2, wherein:
when a positive electrostatic surge is applied to the input-output terminal with the second power supply terminal at the reference potential, the detector detects the application of the electrostatic surge, as a result of a bias being applied, based on a potential of the electrostatic surge, to a diode string formed by a PN junction diode having on an anode side a drain parasitic on the P-type MOSFET for the buffer and the rectifying element, and a relation Vio>V VDD>V VSS being obtained, wherein V VDD, V VSS, and Vio are potentials of the first power supply terminal, the second power supply terminal, and the input-output terminal, respectively.

5. The electrostatic protection circuit according to claim 2, wherein:
when a negative electrostatic surge is applied to the second power supply terminal with the input-output terminal at the reference potential, the detector detects the application of the electrostatic surge, as a result of a bias being applied, based on a potential of the electrostatic surge, to a diode string formed by the PN junction diode having on an anode side a drain parasitic on the P-type MOSFET for the buffer and the rectifying element, and a relation Vio>V VDD>V VSS being obtained, wherein V VDD, V VSS, and Vio are potentials of the first power supply terminal, the second power supply terminal, and the input-output terminal, respectively.

6. The electrostatic protection circuit according to claim 3, wherein:
when a negative electrostatic surge is applied to the input-output terminal with the first power supply terminal at the reference potential, the detector detects the application of the electrostatic surge, as a result of a bias being applied, based on a potential of the electrostatic surge, to a diode string formed by a PN junction diode having on a cathode side a drain parasitic on the N-type MOSFET for the buffer and the rectifying element, and a relation V VDD>V VSS>Vio being obtained, wherein V VDD, V VSS, and Vio are potentials of the first power supply terminal, the second power supply terminal, and the input-output terminal, respectively.

7. The electrostatic protection circuit according to claim 3, wherein:
when a positive electrostatic surge is applied to the first power supply terminal with the input-output at the reference potential, the detector detects the application of the electrostatic surge, as a result of a bias being applied, based on a potential of the electrostatic surge, to a diode string formed by a PN junction diode having on a cathode side the drain parasitic on the N-type MOSFET for the buffer and the rectifying element, and a relation V VDD>V VSS>Vio being obtained, wherein V VDD, V VSS, and Vio are potentials of the first power supply terminal, the second power supply terminal, and the input-output terminal, respectively.

8. The electrostatic protection circuit according to claim 1, wherein:
a source connected gate PMOSFET is connected in parallel between a drain and a source of the P-type MOSFET for the buffer; and
a grounded gate NMOSFET is connected in parallel between the drain and the source of the N-type MOSFET for the buffer.

9. The electrostatic protection circuit according to claim 8, wherein:
the detector compares the potential of the input-output terminal to the potential of the first power supply terminal; and
in the case where the potential of the input-output terminal is higher as a result of the comparison made by the detector, the controller controls the gate potential of the N-type MOSFET for the buffer to a low-level potential and turns off the N-type MOSFET for the buffer.

10. The electrostatic protection circuit according to claim 8, wherein:
the detector compares the potential of the input-output terminal to the potential of the second power supply terminal; and
in the case where the potential of the second power supply terminal is higher as a result of the comparison made by the detector, the controller controls the gate potential of the P-type MOSFET for the buffer to a high-level potential and turns off the P-type MOSFET for the buffer.

11. An electrostatic protection circuit comprising:
a first power supply terminal;
a second power supply terminal;
an input-output terminal for an external connection;
a first P-type MOSFET for the buffer for pulling up a potential of the input-output terminal to the potential of the first power supply terminal;
a first N-type MOSFET for the buffer for pulling down the potential of the input-output terminal to the potential of the second power supply terminal;
a second P-type MOSFET connected between the first power supply terminal and the input-output terminal for the sake of discharging an electrostatic surge;
a second N-type MOSFET connected between the input-output terminal and the second power supply terminal for the sake of discharging the electrostatic surge;
a rectifying element having an anode terminal connected to the first power supply terminal and a cathode terminal connected to the second power supply terminal;
a detector for comparing the potential of the input-output terminal to the potential of the first power supply terminal or comparing the potential of the input-output terminal to the potential of the second power supply terminal to detect whether or not the electrostatic surge is flowing into the input-output terminal; and a controller for controlling either a set of a gate potential of the first N-type MOSFET for the buffer and a gate potential of the second N-type MOSFET or a set of a gate potential of the first P-type MOSFET for the buffer and a gate potential of the second P-type MOSFET when the detector detects inflow of the electrostatic surge and turning on the set of which gate potentials are controlled out of the set of the first N-type MOSFET for the buffer and second N-type MOSFET and the set of the first P-type MOSFET for the buffer and second P-type MOSFET.

12. The electrostatic protection circuit according to claim 11, wherein:
the detector compares the potential of the input-output terminal to the potential of the first power supply terminal; and
in the case where the potential of the input-output terminal is higher as a result of the comparison made by the detector, the controller controls the gate potential of the first N-type MOSFET for the buffer and the gate potential of the second N-type MOSFET to a high-level potential and turns on the first N-type MOSFET for the buffer and the second N-type MOSFET.

13. The electrostatic protection circuit according to claim 11, wherein:
the detector compares the potential of the input-output terminal to the potential of the second power supply terminal; and
in the case where the potential of the second power supply terminal is higher as a result of the comparison made by the detector, the controller controls the gate potential of the first P-type MOSFET for the buffer and the gate potential of the second P-type MOSFET to a low-level potential and turns on the first P-type MOSFET for the buffer and the second P-type MOSFET.

14. The electrostatic protection circuit according to claim 12, wherein:
when a positive electrostatic surge is applied to the input-output terminal with the second power supply terminal at the reference potential, the detector detects the application of the electrostatic surge, as a result of a bias being applied, based on a potential of the electrostatic surge, to a diode string formed by a PN junction diode having on an anode side a drain parasitic on the P-type MOSFET for the buffer and the rectifying element, and a relation Vio>V VDD>V VSS being obtained, wherein V VDD, V VSS, and Vio are potentials of the first power supply terminal, the second power supply terminal, and the input-output terminal, respectively.

15. The electrostatic protection circuit according to claim 12, wherein:
when a negative electrostatic surge is applied to the second power supply terminal with the input-output terminal at the reference potential, the detector detects the application of the electrostatic surge, as a result of a bias being applied, based on a potential of the electrostatic surge, to a diode string formed by the PN junction diode having on an anode side a drain parasitic on the P-type MOSFET for the buffer and the rectifying element, and a relation Vio>V VDD>V VSS being obtained, wherein V VDD, V VSS, and Vio are potentials of the first power supply terminal, the second power supply terminal, and the input-output terminal, respectively.

16. The electrostatic protection circuit according to claim 13, wherein:
when a negative electrostatic surge is applied to the input-output terminal with the first power supply terminal at the reference potential, the detector detects the application of the electrostatic surge, as a result of a bias being applied, based on a potential of the electrostatic surge, to a diode string formed by a PN junction diode having on a cathode side a drain parasitic on the N-type MOSFET for the buffer and the rectifying element, and a relation V VDD>V VSS>Vio being obtained, wherein V VDD, V VSS, and Vio are potentials of the first power supply terminal, the second power supply terminal, and the input-output terminal, respectively.

17. The electrostatic protection circuit according to claim 13, wherein:
when a positive electrostatic surge is applied to the first power supply terminal with the input-output at the reference potential, the detector detects the application of the electrostatic surge, as a result of a bias being applied, based on a potential of the electrostatic surge, to a diode string formed by a PN junction diode having on a cathode side the drain parasitic on the N-type MOSFET for the buffer and the rectifying element, and a relation V VDD>V VSS>Vio being obtained, wherein V VDD, V VSS, and Vio are potentials of the first power supply terminal, the second power supply terminal, and the input-output terminal, respectively.

18. An electrostatic protection circuit comprising:
a first power supply terminal;
a second power supply terminal;
an input-output terminal for an external connection;
a P-type MOSFET for a buffer for pulling up a potential of the input-output terminal to the potential of the first power supply terminal;
an N-type MOSFET for the buffer for pulling down the potential of the input-output terminal to the potential of the second power supply terminal;
a rectifying element having an anode terminal connected to the first power supply terminal and a cathode terminal connected to the second power supply terminal;
a first detector for comparing the potential of the input-output terminal to the potential of the first power supply terminal to detect whether or not an electrostatic surge is flowing into the input-output terminal;
a second detector for comparing the potential of the input-output terminal to the potential of the second power supply terminal to detect whether or not an electrostatic surge is flowing into the input-output terminal;
a first controller for controlling a gate potential of the N-type MOSFET for the buffer when the first detector detects inflow of the electrostatic surge and turning off the N-type MOSFET for the buffer, and
a second controller for controlling a gate potential of the P-type MOSFET for the buffer when the second detector detects inflow of the electrostatic surge and turning off the P-type MOSFET for the buffer.

19. The electrostatic protection circuit according to claim 1, wherein the P-type MOSFET for the buffer and the N-type MOSFET for the buffer function as an input-output buffer for a semiconductor device which uses the electrostatic protection circuit.

20. The electrostatic protection circuit according to claim 11, wherein the first P-type MOSFET for the buffer and the first N-type MOSFET for the buffer function as an input-output buffer for a semiconductor device which uses the electrostatic protection circuit.

* * * * *